United States Patent [19]

Tsuruta

[11] Patent Number: 5,449,883
[45] Date of Patent: Sep. 12, 1995

[54] CONTINUOUS HEAT TREATMENT SYSTEM OF SEMICONDUCTOR WAFERS FOR ELIMINATING THERMAL DONOR

[75] Inventor: Shoji Tsuruta, Tokyo, Japan

[73] Assignees: Mitsubishi Materials Corporation; Mitsubishi Materials Silicon Corporation, both of Tokyo, Japan

[21] Appl. No.: 41,316

[22] Filed: Mar. 31, 1993

[30] Foreign Application Priority Data

Aug. 7, 1992 [JP] Japan .................................. 4-232747

[51] Int. Cl.⁶ ........................................... H05B 1/02
[52] U.S. Cl. ...................................... 219/483; 219/485; 219/486; 219/388; 219/121.43; 204/308; 432/44; 432/48; 432/53
[58] Field of Search ...................... 219/121.43, 121.44, 219/388, 494, 497, 483–486; 156/345; 432/44, 48, 51–53; 204/308

[56] References Cited

U.S. PATENT DOCUMENTS

| | | | |
|---|---|---|---|
| 4,693,777 | 9/1987 | Hazano et al. | 156/345 |
| 4,876,437 | 10/1989 | Kondo | 219/388 |
| 5,003,160 | 3/1991 | Matsuo et al. | 219/494 |
| 5,060,354 | 10/1991 | Chizinsky | 29/25.02 |
| 5,200,017 | 4/1993 | Kawasaki et al. | 156/345 |

FOREIGN PATENT DOCUMENTS 0306967  3/1989  European Pat. Off. .
62-259906  11/1987  Japan .

*Primary Examiner*—Mark H. Paschall
*Attorney, Agent, or Firm*—Sughrue, Mion, Zinn, Macpeak & Seas

[57] ABSTRACT

A heat treatment system is fabricated from a loading section, a heat treatment section and a outlet section integrated with one another, and the heat treatment section comprises a transfer mechanism provided between the loading section and the outlet section for successively transferring silicon wafers, a heating unit provided along the transfer mechanism for heating the silicon wafers, and a cooling unit provided along the transfer mechanism and closer to the outlet section than the heating section for cooling the silicon wafers so that the silicon wafers are continuously treated with heat for annihilating thermal donors produced from oxygen during the growth of a silicon crystal without any handling by operators.

5 Claims, 13 Drawing Sheets

CONTINUOUS HEAT TREATMENT SYSTEM OF SEMICONDUCTOR WAFERS FOR ELIMINATING THERMAL DONOR

FIELD OF THE INVENTION

This invention relates to a heat treatment system of semiconductor wafers and, more particularly, to an automatic heat treatment system of semiconductor wafers for eliminating thermal donor.

DESCRIPTION OF THE RELATED ART

A Czochalski crystal grower is widely used in crystal growth of silicon, and a silicon rod is produced from melted silicon in a quartz crucible. While the Czochalski crystal grower is pulling a silicon seed up, the quartz crucible is slightly dissolved into the melt charge, and releases oxygen into the melted silicon. The oxygen released in the melted silicon is introduced in the silicon crystal during the crystal growth, and portion of the oxygen acts as thermal donor after successive thermal history in the grower. For this reason, the as-grown silicon rod is initially doped with the thermal donor, which affects intentionally controlled electrical resistivity of the silicon. When a semiconductor device manufacturer fabricates a semiconductor device on a silicon wafer sliced from the as-grown silicon rod, the semiconductor device manufacturer can not confirm the exact conductive type and resistivity of the water due to the thermal donor. Namely the thermal donor compensates the acceptor in intrinsic p-type wafer to make wafer higher resistivity of p-type or to change conductive type into n-type. On the other hand, a wafer doped with donor impurity results in far lower resistivity.

In order to guarantee the semiconductor device manufacturer true conductive type and resistivity, the thermal donor should be annihilated or killed before the wafer is shipped. Generally, donor killer processes is carried out through a heat treatment. Namely, the as-grown silicon rod is sliced into silicon wafers, and the silicon wafers are shaped and etched, as well known to a person skilled in the art. After the etching, the silicon wafers are heated over 500 degrees in centigrade for killing the thermal donor. FIG. 1 illustrates time needed for completing the donor annihilation in terms of temperature. As understood from Plots A, the time period decreases with the increasing temperature of the silicon wafer, wherefrom the activation energy is assumed to be 2.7 eV.

The donor-annihilation process through the heat treatment is delicate, because the thermal donor is susceptible to thermal energy. For example, if the silicon wafers are rapidly cooled around 450 degrees in centigrade, the annihilated thermal donor remains inactive. If not, the thermal donor is activated again, and such undesirable phenomenon becomes more serious to a large-size wafer such as an 8-inch silicon wafer. Moreover, if the silicon wafers are maintained around 700 degrees in centigrade for long time period, so called new donor generates. This means that the temperature sequence must be strictly controlled throughout the heat treatment including cooling.

The circuit components of a semiconductor integrated circuit are progressively miniaturized, and the silicon wafer is enlarged. A large number of semiconductor integrated circuits are simultaneously fabricated on a single large-size silicon wafer, and the large number of semiconductor integrated circuits must be of uniform in device characteristics so that the production yield is kept in high. For this reason, the semiconductor device manufacture requests the wafer manufacture to achieve uniformity throughout the large-sized silicon wafer, and the wafer manufacture needs to strictly control the heat treatment process. Further, the heat treatment is recognized to relate to formation of precipitation-cores of oxygen in the intrinsic gettering technology.

One of the prior art heat treatment systems is illustrated in FIG. 2, and schematically comprises a loading section 1, a heating section 2 and a cooling section 3. A cassette 4 holds a predetermined number of silicon wafers 5, which are then placed on a boat 1a in a line. The boat 1a is, then, carried to a lateral furnace tube 2a of the heating section 2, and is inserted into a heating zone C1 of the lateral furnace tube 2a. The silicon wafers 5 are heated in the lateral furnace tube 2a, and a controller 2a controls the lateral furnace tube 2a to keep at a predetermined temperature. The boat 5 is stationary in the lateral furnace tube 2a during heat treatment. After the heat treatment, the boat 5 is taken out from the lateral furnace tube 2a, and is carried to the cooling section 3. The cooling section is equipped with a plurality of cooling fan units 3a, and the cooling fan units 3a blow cool air to the silicon wafers 5 on the boat 1a. The cool air rapidly cools down the silicon wafers 5, and the silicon wafers 5 are accelerated to pass through the temperature range around 450 degrees in centigrade. The boat 5 is also stationary in the cooling section during cooling period.

Another prior art heat treatment system is equipped with a vertical furnace tube 6a as shown in FIG. 3, and the vertical furnace tube 6a forms a part of a heating section 6 with a heating zone C2. Silicon wafers 7 are loaded from a cassette 8 to a vertical boat 9a of a loading section 9, and the vertical boat 9a is inserted into the vertical furnace tube 6a from the bottom. The vertical boat 9a is also stationary in the vertical furnace tube 6a during heating period, and a controller 6b controls the vertical furnace tube 6a at a predetermined temperature. After the heat treatment, the vertical boat 9a is taken out from the vertical furnace tube 6a, and the silicon wafers 7 are rapidly cooled by using cooling fan units, by similar way of afore-mentioned example. The vertical furnace tube 6a is preferably used for a large-sized silicon wafer such as an 8-inch silicon wafer.

A rapid-thermal-annealing furnace incorporated in yet another prior art heat treatment system is illustrated in FIG. 4, and a transparent furnace tube 10a surrounded by a reflector 10b, and a tungsten halogen lamp array 10c provided between the furnace tube 10a and the reflector 10b. The inlet of the furnace tube 10a is sealed by a flange 10d, and gas purge nozzle 10e is inserted into the furnace tube 10a. A radiation thermometer 10f monitors the wafer temperature 11 in the furnace tube 10a. A quartz suscepter 10g is provided in the furnace tube 10a for supporting the wafer 11.

In operation, a silicon wafer 11 is mounted on the quartz suscepter 10g, and the tungsten halogen lamp array 10c radiates infrared light to heat the silicon wafer 11 directly. The expected wafer-temperature ranges between 500 degrees to 700 degrees in centigrade, and is higher than those of the first and second prior art heat treatment systems. However, the silicon wafer is also stationary in the furnace tube 10a.

The first and second prior art heat treatment systems heat the silicon wafers 5 and 7 from 600 degrees to 650 degrees in centigrade for 30 to 60 minutes. Although oxygen is liable to be precipitated in such a relatively low temperature range, the heat treating sequences are stable to oxygen-precipitation and are commonly used.

However, problems are encountered in the first and second prior art heat treatment systems, that is, poor operability, mishandling, low throughput, undesirable dust and uneven heat application. In detail, a certain number of the silicon wafers 5 and 7 are placed on the boats 1a and 9a, and are heat-treated at a time in the furnace tubes 2a and 6a. If the boat 1a or 9a does not be filled with predetermined number of the silicon wafers 5 or 7, dummy wafers are added on the boats 1a and 9a together with the silicon wafers 5 and 7, and the first and second prior art heat treatment systems require operators to confirm every boat 1a or 9a whether dummy wafers were added or not. This results in poor operability and possible trouble to mix different wafers to proper wafers.

Moreover, if the furnace tubes 2a and 6a are long enough to hold a plurality of boats 1a and 9a, all of the boats need to hold silicon wafers identical in size to be heat-treated at a time. However, if any one of the boats holds silicon wafers of different size, the heat treatment may not be suitable for these silicon wafers. Therefore, the second problem inherent in the first and second prior art heat treatment systems is high possibility of mishandling.

The third problem relates to the batch furnace tubes 2a and 6a. Since the boats 1a and 9a are stationary in the furnace tubes 2a and 6a, operators need to repeat replacement of the boats 1a and 9a, and to replace them very slowly not to damage the wafers in every batch operation. This means that the first and second prior art heat treatment systems suffer from low throughput.

As described before, the silicon wafers 5 and 7 heat-treated in the furnace tubes 2a and 6a are rapidly cooled by the cooling fan units 3a, and the silicon wafers 5 and 7 tend to become dirty due to dust particles in the air. The dust particles may cause turbulences of a fabrication process for a semiconductor integrated circuit device, and degrade the silicon wafers 5 and 7.

The final problem inherent in the first and second prior art heat treatment systems is uneven heat application. This is caused by the fact that the boats 1a and 9a hold the silicon wafers 5 and 7, and that contact areas between the silicon wafers and the boats are liable to be difference in temperature. This results in uneven resistivity, and partial fluctuation in resistivity is causative of defective products. Thus, the first and second prior art heat treatment systems have various problems.

The third prior art heat treatment system equipped with the rapid-thermal-annealing furnace is free from the first, second and final problems, because the silicon wafer 11 is mounted on the quartz susceptor 10g. However, the rapid-thermal-annealing furnace is of the batch furnace, and the third heat-treatment system also suffers from low throughput. Another problem inherent in the third heat treatment system is uneven heat application due to difference in surface state and in thickness between the silicon wafers. The emissivity coefficient of radiation, is strongly affected by the surface state especially in middle temperature range from 500 degrees to 700 degrees in centigrade. The change in emissivity affects heat-transfer to wafer surface to shift wafer temperature from the expected temperature. On the other hand, the change in thickness results in change in heat capacity of wafer also to shift the wafer temperature. As a result, silicon wafers treated by the third prior art system possibly suffers from abnormal resistivity.

SUMMARY OF THE INVENTION

It is therefore an important object of the present invention to provide a heat treatment system which is free from the problems inherent in the prior art heat treatment system.

To accomplish the object, the present invention proposes to integrate a heating means and a cooling means with a transfer mechanism for successively treating semiconductor wafers with heat.

In accordance with the present invention, there is provided a heat treatment system for semiconductor wafers comprising a) a loading section for supplying the semiconductor wafers in succession, b) an outlet section for receiving the semiconductor wafers after heat treatment, and c) a heat treatment section associated with the loading section and the outlet section, and having c-1) a transfer mechanism provided between the loading section and the outlet section for successively transferring the individual semiconductor wafers from the loading section to the outlet section at predetermined speed, c-2) a heating means provided at a first predetermined position along the transfer mechanism for heating the semiconductor wafers, and c-3) a cooling means provided at a second predetermined position closer to the outlet section than the first predetermined position along the transfer mechanism for cooling the semiconductor wafers.

If the semiconductor wafers are of silicon, the transferring mechanism conveys the semiconductor wafers at V millimeter/second expressed as $$V = (0.3T - a) \times (Lx/900) \times (650/tx)$$

where Lx in mm is length of heating zone held at constant temperature along, T is the constant temperature in degree in centigrade in ambient heated by the heating means, tx is thickness of each semiconductor wafer in micron meter, and a is a coefficient ranging from 180 to 200.

BRIEF DESCRIPTION OF THE DRAWINGS

The features and advantages of the heat treatment system according to the present invention will be more clearly understood from the following description taken in conjunction with the accompanying drawings in which.

DESCRIPTION OF THE PREFERRED EMBODIMENTS

First Embodiment

Figure 5:
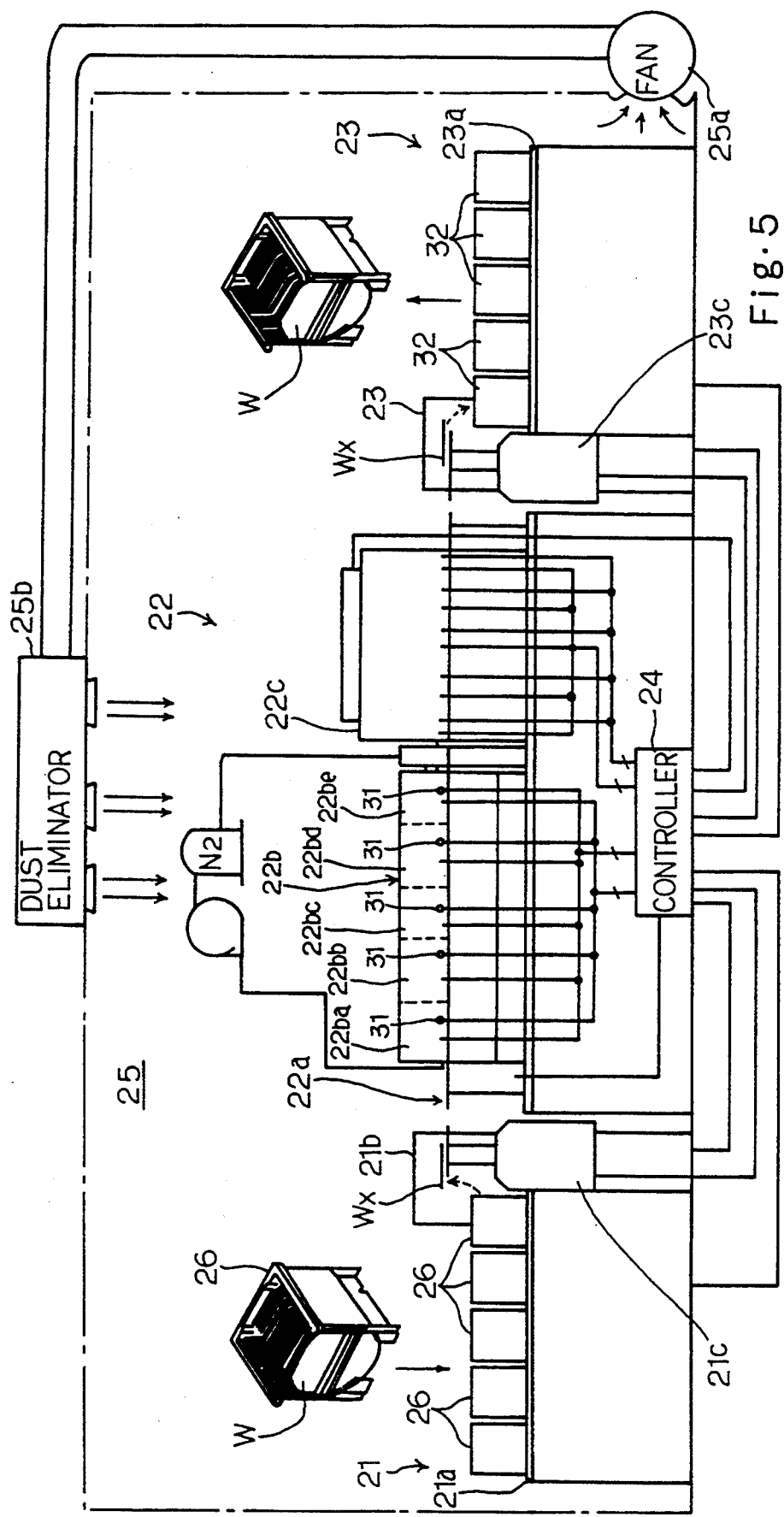
FIG. 5 is a front view showing the structure of a heat treatment system according to the present invention.

Referring to FIG. 5 of the drawings, a heat treatment system embodying the present invention largely comprises a loading section 21, a heat treatment section 22, an outlet section 23 and a controller 24, and is installed in a clean room 25 associated with a fan 25a and a dust eliminator 25b. The clean room 25, the fan 25a and the dust eliminator 25b form in combination an air circulation loop, and dust particles are eliminated from the circulated air.

The loading section 21 is implemented by a cassette loader, and a typical example of the cassette loader is disclosed in Japanese Patent Application No. 62-259906. The cassette loader implementing the loading section 21 comprises a turn table 21a, a robotic hand mechanism 21b and a bridge table 21c, and a plurality of wafer cassettes 26 are circulated on the turn table 21a. Each of the wafer cassettes 26 holds a plurality of silicon wafers each labeled with "W", and the wafer cassettes 26 are intermittently moved toward a loading position in front of the bridge table 21c. The robotic hand unit 21b sequentially takes out the silicon wafers W from the wafer cassette 26, and places each silicon wafer W on the bridge table 21c. The bridge table 21c supplies each silicon wafer W to the heat treatment section 22. When all of the silicon wafers W are taken out from the wafer cassette 26, the empty wafer cassette 26 is left from the position in front of the bridge table 21c, and the next wafer cassette 26 is moved to the position. The empty wafer cassette 26 is taken out from the turn table 21a, and is replaced with a new wafer cassette 26 holding silicon wafers W.

The heat treatment section 22 largely comprises a transferring mechanism 22a, a heater unit 22b and a cooling unit 22c. The transferring mechanism 22a extends over the heat treatment section 22, and has an inlet end in the vicinity of the loading section 21 and an outlet end close to the outlet section 23. The transferring mechanism 22a passes through the heating unit 22b and the cooling unit 22c, and sequentially conveys the silicon wafers W from the inlet end through the heating and cooling units 22b and 22c to the outlet end. While passing through the heating unit 22b and the cooling unit 22c, each silicon wafer W is heated and, thereafter, cooled, and the thermal donor is effectively annihilated through the heat treatment.

Figure 6:
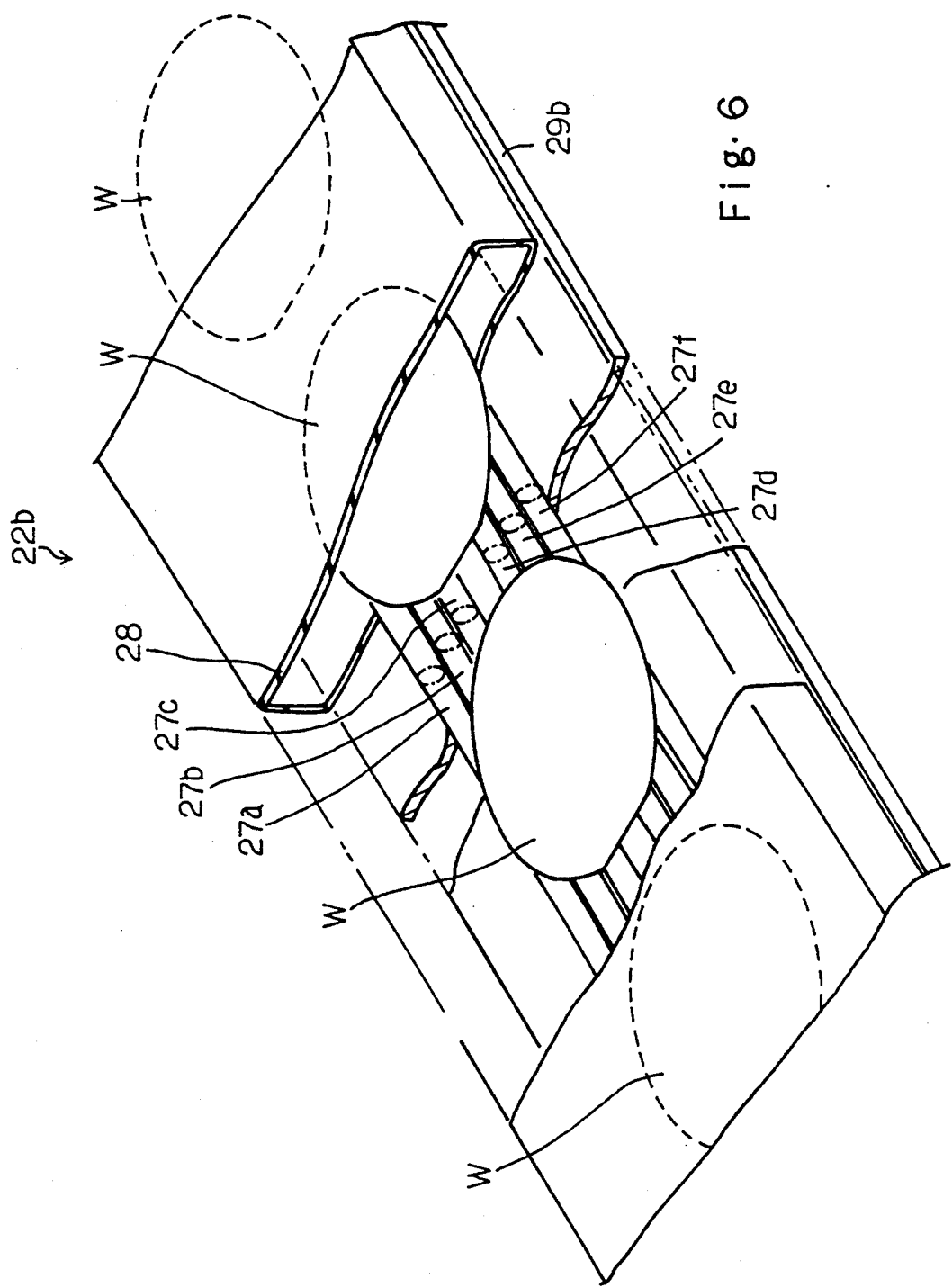
FIG. 6 is a perspective view showing silicon wafers continuously traveling a transferring path in the heat treatment system.
Figure 7:
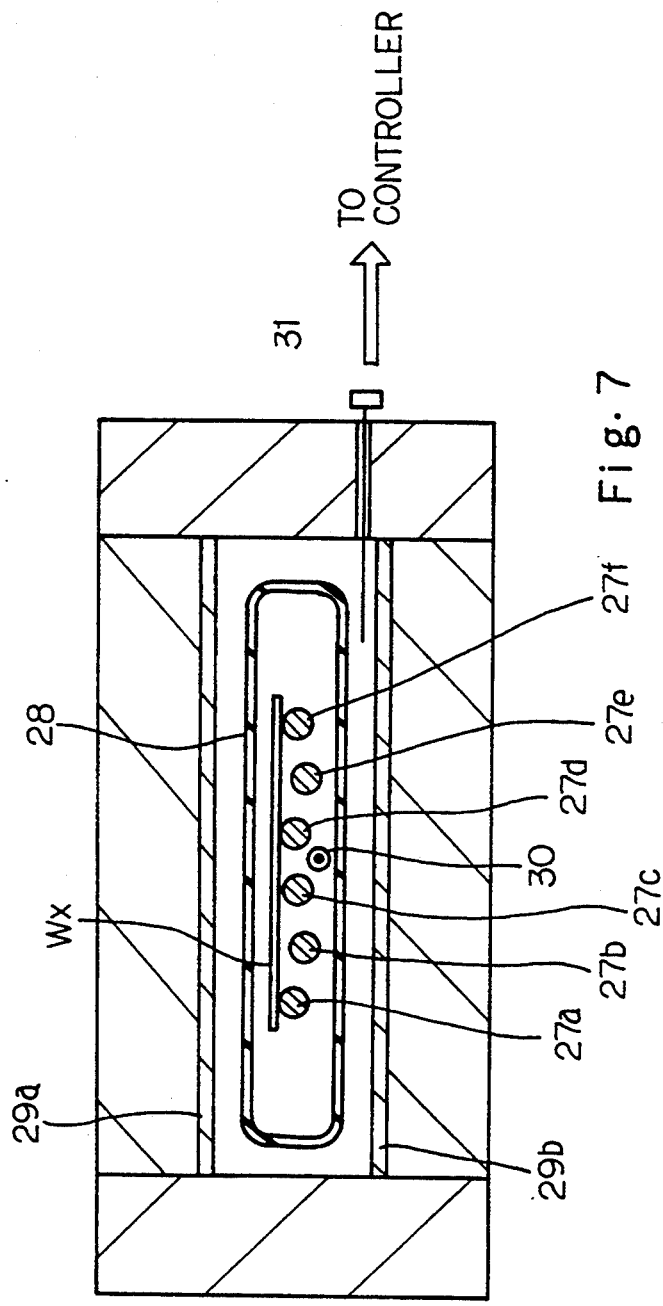
FIG. 7 is a cross sectional view showing walking beams enclosed in a quartz tube passing through a heating unit.

Turning to FIGS. 6 and 7, a part of the transferring mechanism 22a associated with the heating unit 22b is illustrated in detail. The transferring mechanism 22a is implemented by a waking beam system. The walking beam system comprises six walking beams 27a, 27b, 27c, 27d, 27e and 27f, and the waking beams 27a to 27f are enclosed in a quartz tube 28 and held at both inlet and outlet of the tube 28. The waking beams 27a to 27f are formed of quartz and into rod-shaped configuration. The quartz tube 28 has a generally rectangular cross-section, and defines a generally rectangular hollow space. The walking beams 27a to 27f are moved in the quartz tube 28, and the silicon wafers W are sequentially relayed from a walking beam section to the next section. Although not shown in the drawings, a gas inlet nozzle is provided at center of the quartz tube 28, and inert gas such as, for example, nitrogen gas flows in the generally rectangular hollow space. The nitrogen gas is exhausted into a gas suction nozzle 30 provided at the both ends of the quartz tube 28 as will be seen in FIG. 7. Therefore, while traveling in the heating unit 22b, the silicon wafers W are sealed in the nitrogen atmosphere along the heating unit 22b, and are, accordingly, prevented from the air.

Figure 1:
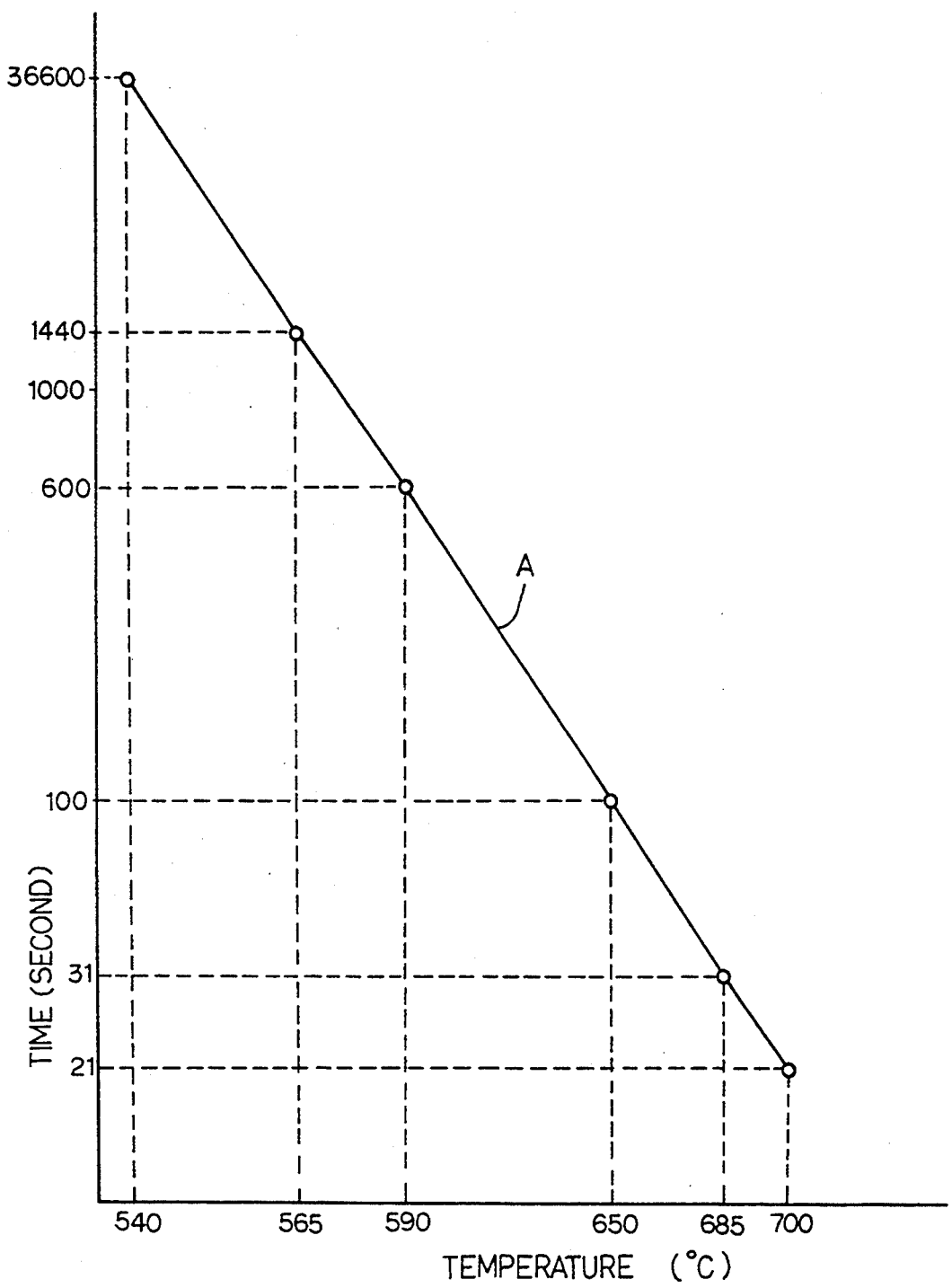
FIG. 1 is the graph showing the time for donor annihilating in terms of the temperature of the silicon wafers.
Figure 2:
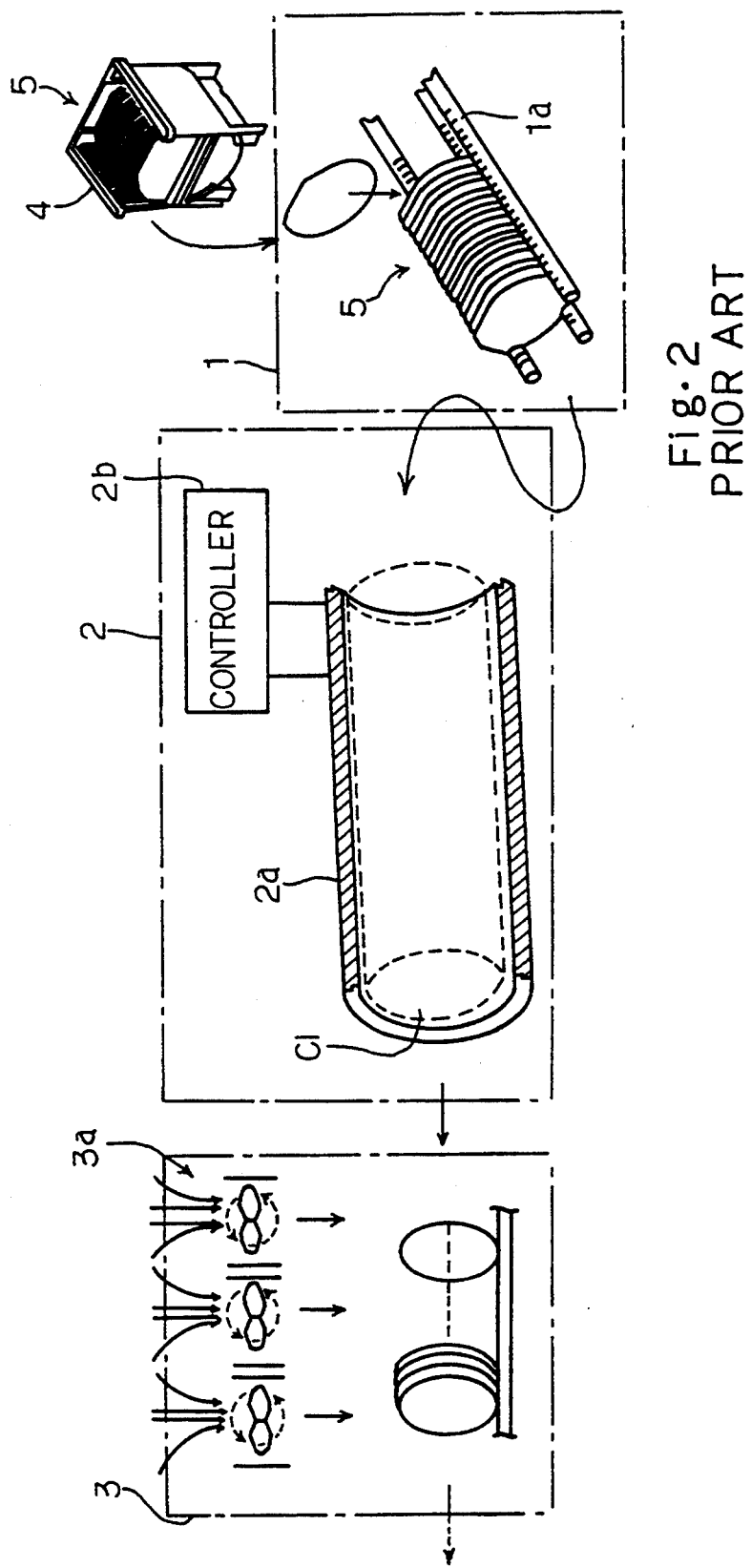
FIG. 2 is a schematic view showing the prior art heat treatment system.
Figure 3:
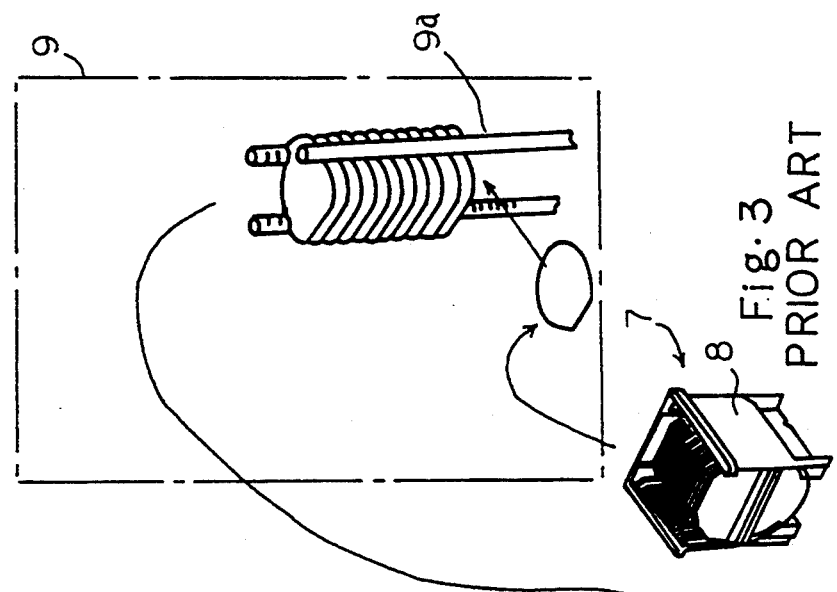
FIG. 3 is a schematic view showing another prior art heat treatment system.
Figure 4:
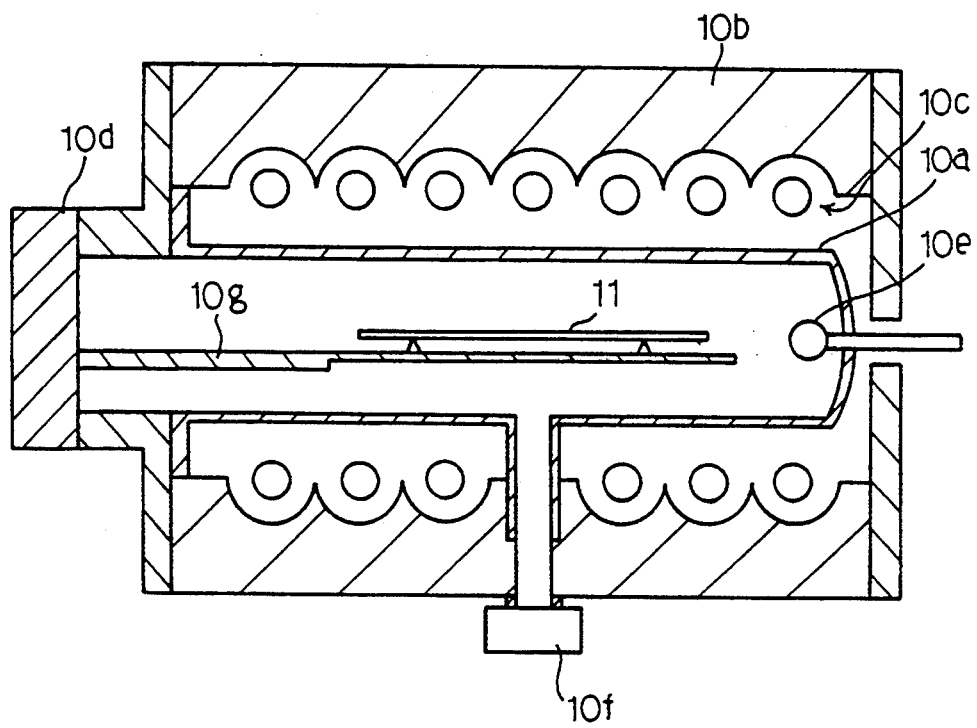
FIG. 4 is a cross sectional view showing the rapid-thermal-annealing furnace incorporated in yet another prior art heat treatment system.

The heating unit 22b is implemented by upper and lower heater assembly 29a and 29b extending over predetermined length along the quartz tube 28, and the heater assembly 29a and 29b are replaceable with a lamp array for radiating infrared light. In this instance, the predetermined length is 1500 millimeters, and the heater assembly 29a and 29b can heat the silicon wafers W over 600 degrees in centigrade. The heating unit 22b comprises five heating blocks 22ba, 22bb, 22bc, 22bd and 22be (see FIG. 5), and the temperature of the five heating blocks 22ba to 22be can be independently controllable. However, in this instance, the five heating blocks 22ba to 22be are adjusted to a predetermined temperature as described hereinbelow. Namely, even if the silicon wafers W are sliced from a same silicon rod, the silicon wafers W are not strictly identical in properties with one another, and the thermal donor of a silicon wafer is effectively killed along a certain temperature profile different from another temperature profile appropriate for another silicon wafer. For this reason, test wafers are taken out from the top portion and the bottom portion, respectively, and appropriate temperature profile is looking for each test wafer through simulation. Namely, a thermo-couple (not shown) is attached to each of the test wafers for monitoring temperature profile, i.e., temperature elevation and temperature decay, and the resistivity and the precipitated oxygen of each test wafer are measured after the heat treatment. The thermal energy applied to the test wafer is equivalent to, for example, 700 degrees in centigrade for 21 seconds, 685 degrees in centigrade for 31 seconds, 590 degrees in centigrade for 100 seconds and 565 degrees in centigrade for 1440 seconds or 24 minutes (see FIG. 1). In this manner, the heat treatment is simulated for the test wafers, and the temperature profiles are optimized for the test wafers. The temperature profiles sliced from the same silicon rod are further optimized from the temperature profiles of the test wafers, and the optimum transferring speeds are determined from the optimum temperature profiles.

Figure 8:
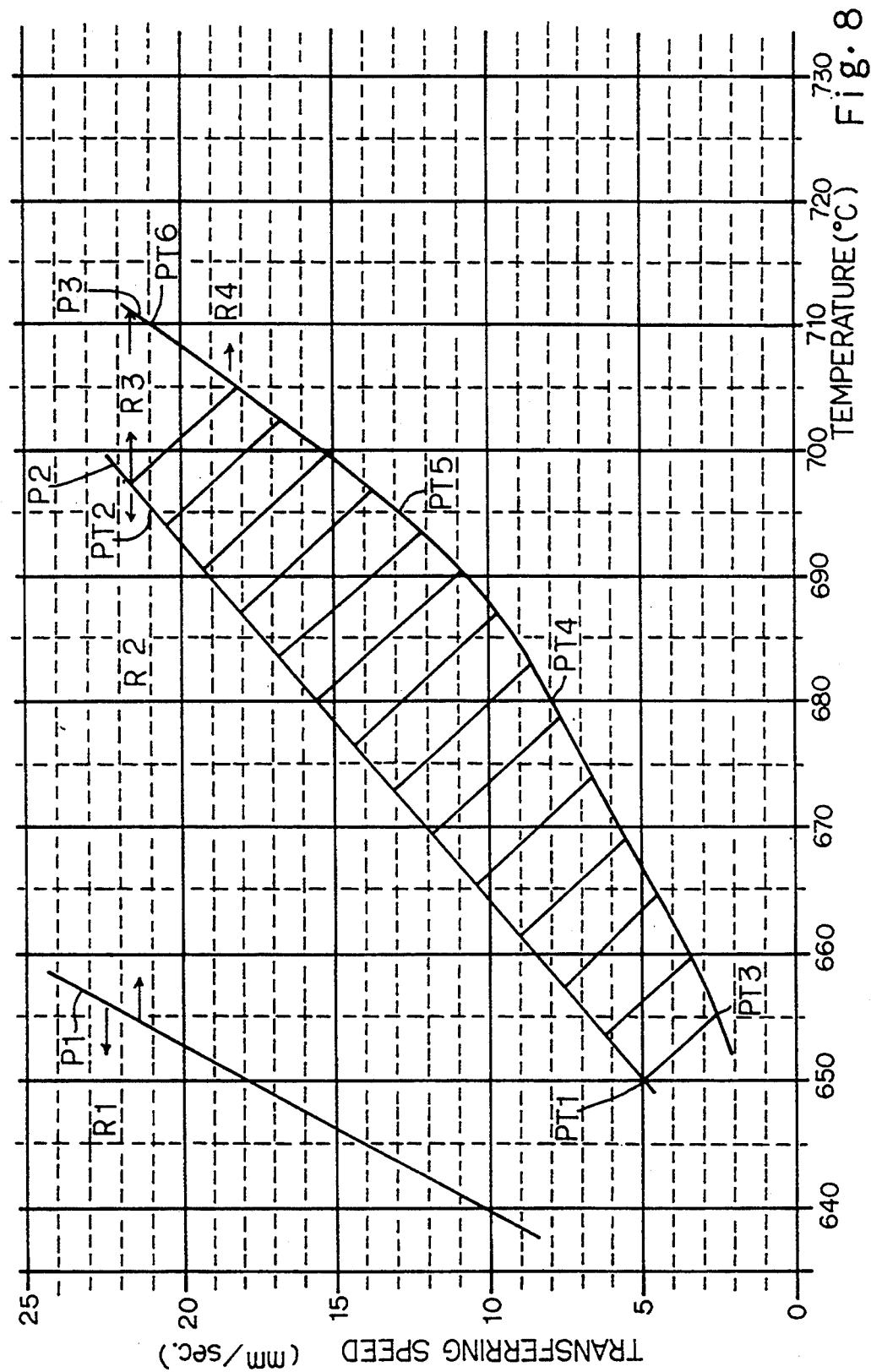
FIG. 8 is a graph showing effective heat treatment conditions for annihilating the thermal donor.

FIG. 8 shows an acceptable control range to satisfy the thermal-donor-annihilation and the controlled precipitation of oxygen. A silicon wafer W is sliced from a bottom portion of a silicon rod, plots P1 is indicative of a boundary in view of the thermal donor. If combination of the transferring speed and the temperature in the quartz tube 28 are plotted on the left side of the Plots P1, a substantial amount of the thermal donor is left in the silicon wafer W sliced from the bottom portion of the silicon rod, and the silicon wafer W hardly satisfies a standard design specification of semiconductor device manufactures. On the other hand, the combination is plotted on the right side of the Plots P1, the thermal donor is effectively decreased from the silicon wafer W sliced from the bottom portion, and the properties of the silicon wafer W are fallen into the standard design specification. If, on the other hand, a silicon wafer W is sliced from a top portion of the silicon rod, Plots P2 are indicative of the boundary. Namely, if the combination is plotted on the left side of the Plots P2, the silicon wafer W sliced from the top portion contains a substantial amount of thermal donor, and the silicon wafer can not satisfy the standard design specification. However, if the combination is plotted on the right side, the thermal donor is effectively decreased from the silicon wafer W, and the silicon wafer W is acceptable. Plots P3 are indicative of a boundary in view of precipitated oxygen, and the boundary indicated by Plots P3 is applicable for the silicon wafers W sliced from both top and bottom portions. If the combination is plotted on the right side of Plots P3, oxygen is less precipitated in the silicon wafers W, and the silicon wafers are out of the range of controlled precipitation of oxygen. On the other hand, if the combination is plotted on the left side, the precipitation of oxygen is in the controlled range, and the silicon wafers W are available for semiconductor integrated circuits. As a result, while the combination is fallen into range R3 between Plots P2 and Plots P3, the properties of the silicon wafer W satisfies the standard design specification in view of the controllability in resistivity as well as the precipitation of oxygen regardless of the location in the silicon rod. The range R3 is roughly defined by first, second and third quasi straight lines, and the first quasi straight line is determined by first and second points PT1 and PT2 respectively indicative of 5 millimeter/second and 650 degrees in centigrade, and 21 millimeter/second and 695 degrees in centigrade. The second quasi straight line is determined by third and fourth points PT3 and PT4 indicative of 2.5 millimeter/second and 655 degrees in centigrade, and 8 millimeter/second and 680 degrees in centigrade, respectively. The third quasi straight line is determined by fifth and sixth points PT5 and PT6 indicative of 13 millimeter/second and 695 degrees in centigrade, and 21 millimeter/second and 710 degrees in centigrade, respectively. Range R2 between Plots P2 and P1 is only available for the silicon wafer W sliced from the bottom portion. However, range R1 is never available for all of the silicon wafers. A silicon wafer W closer to the top of the silicon rod requires longer time period in higher temperature, and oxygen is precipitated in a silicon wafer conveyed at low speed over relatively wide 0 temperature range. These tendencies are equally observed regardless of the conductivity type of the silicon wafer, i.e., both p-type and n-type silicon wafers. Although Plots P3 are indicative of the boundary applicable regardless of the location of the silicon rod, decrement of precipitated oxygen is more remarkable in a silicon wafer sliced from a bottom potion at high temperature. Moreover, oxygen tends to be less precipitated in central area of a silicon wafer W.

Figure 9:
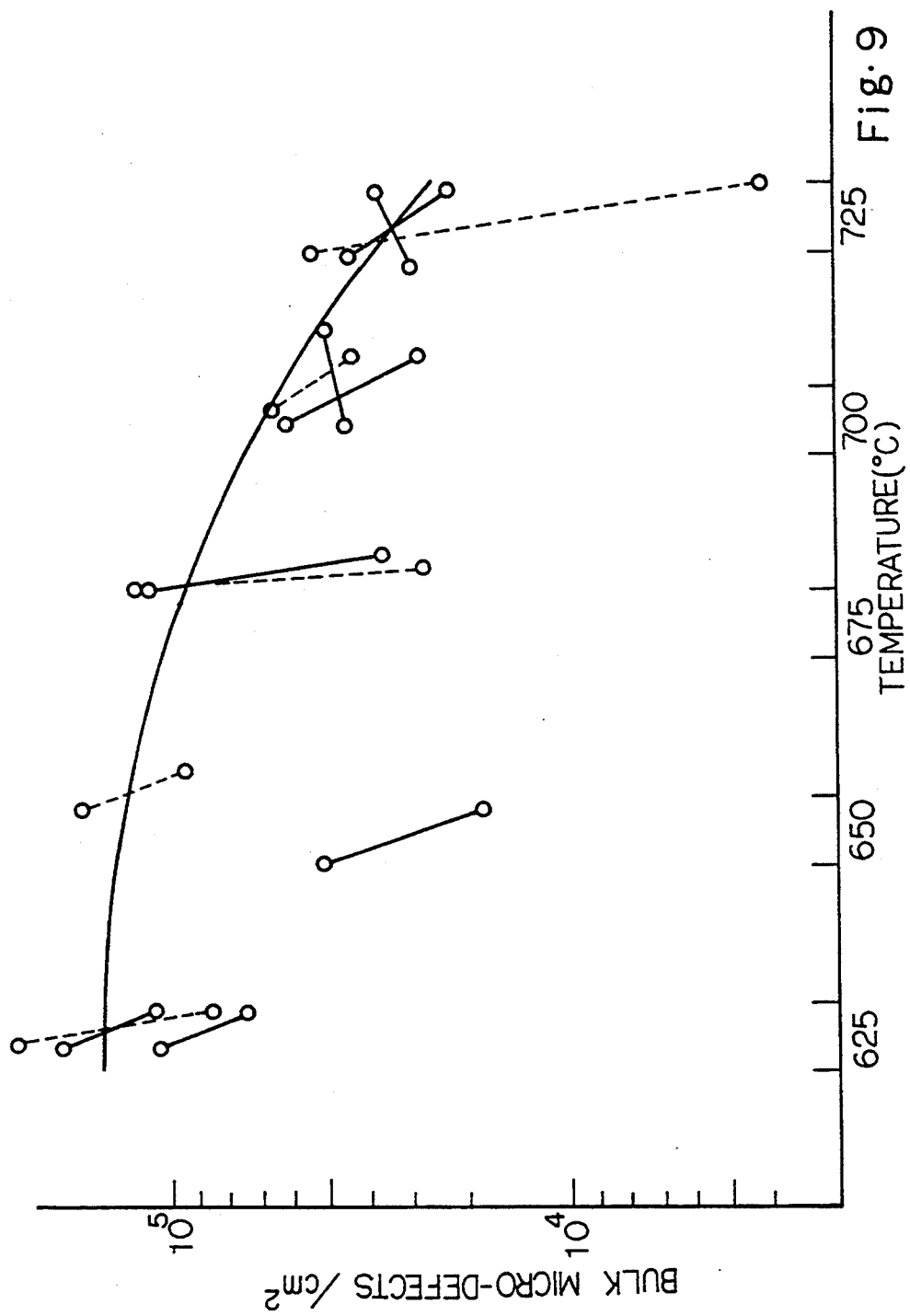
FIG. 9 is a graph showing relation among the density of bulk micro-defects, temperature and the transferring speed.

The heat treatment has influences on not only the thermal donor and the precipitation of oxygen but also density of bulk micro-defects. FIG. 9 illustrates relation among the amount of bulk micro-defects, the ambient temperature in the quartz tube 28 and the transferring speed for a silicon wafer low in oxygen concentration from $1.1 \times 10^{17}$ atom/cm$^3$ to $1.3 \times 10^{17}$ atom/cm$^3$. The transferring speed is varied from 14 millimeter/second through 20 millimeter/second to 24 millimeter/second, and shown with thin real lines, dot lines and thick real lines, respectively. The silicon wafer of low oxygen concentration is decreased in bulk micro-defect density so far as the silicon wafer is treated in high temperature, and this tendency may be considered to be controlled by optimizing the transferring speed and the temperature in the quartz tube 28.

Turning back to FIG. 5, data information indicative of the optimum transferring speeds and the temperature are memorized in a data storage facility of the controller 24 implemented by a computer system, and the controller 24 controls the walking beam sections. A plurality of thermometers 31 are respectively inserted into the heating blocks 22ba to 22be, and the temperature of each heating block is monitored by the associated thermometer 31. The temperature of each heating section is reported to the controller 24, and the controller 24 regulates the upper and lower heating plates 29a and 29b so as to trace the optimum temperature profiles memorized in the data storage facility.

The walking beam system in heating unit 22b is also associated with the another walking beam system in the cooling unit 22c, and each of the walking beam system is composed of six rod-shaped quartz walking beams and is synchronized. When the heat-treated silicon wafers W reach the outlet end of the transferring mechanism 22a, the silicon wafers are sequentially relayed from the heating unit 22b to the cooling unit 22c. The silicon wafers W proceeds along a tunnel formed in the cooling unit 22c, and are exposed to cooling gas in the tunnel the coolant gas flows through either closed or open system. Though not shown in the drawings, thermo-meters are provided in the cooling unit 22c, and the temperature in the tunnel is reported to the controller 24. The controller 24 controls the amount of the cooling gas blown to the silicon wafers W and causes the silicon wafers W to rapidly pass around 450 degrees in centigrade so as to prevent the silicon wafers W from activation of thermal donor.

The outlet section 23 is implemented by a cassette unloader, and is comprises a turn table 23a, a robotic hand mechanism 23b and a bridge table 23c. A plurality of empty wafer cassettes 32 are circulated on the turn table 23a, and reach to an unloading position in front of the bridge table 23c. The silicon wafers W are sequentially delivered from the cooling unit 22c, and the robotic hand mechanism 23b inserts the silicon wafers W into the empty wafer cassette 32 at the unloading position. When the wafer cassette 32 holds a predetermined number of silicon wafers W, the wafer cassettes 32 are intermittently moved. As a result, the cassette filled with the silicon wafers W is left from the unloading position, and a new empty cassette 32 arrives at the unloading position.

Description is hereinbelow made on a heat treatment sequence according to the present invention, and is focused on a single silicon wafer Wx. A wafer cassette 26 holding the silicon wafer Wx is moved to the loading position, and the robotic hand mechanism 21b supplies the silicon wafer Wx from the wafer cassette 26 through the bridge table 21c to the waling beam system 22a. The silicon wafer Wx is sequentially relayed through the walking means sections, and passes through the quartz tube 28 associated with the heating plates 29a and 29b at 20 millimeter per second. For example, if the heating zone 22B is regulated at T,685 degrees in centigrade, the silicon wafer Wx is 625 microns in thickness, length of heating zone held at constant temperature T is 1500 millimeters, and a ranges from 180 to 200, then the transferring speed V is given as follows.

$$V = (0.3T - a) \times (Lx/900) \times (650/tx)$$
$$= 9.5 \text{ to } 44.3 \text{ millimeter/second}$$

The coefficient is determined depending upon the position of a silicon rod from which the silicon wafer Wx is sliced. If the silicon wafer Wx is sliced from a top portion of the silicon rod, the coefficient a ranges between 187 and 193, and the silicon wafer Wx is heated for relatively long time period, because elimination of the thermal donor from the top portion is relatively difficult. This means that the transferring mechanism 22b is regulated between 21.7 to 32.1 millimeter per second. While the silicon wafer Wx travels in the quartz tube 28, the thermal donor in the silicon wafer W is killed.

The silicon wafer Wx proceeds from the heating unit 22b to the cooling unit 22c, and is continuously transferred by means of the walking beam systems. While passing through the cooling unit 22c, the silicon wafer Wx is rapidly cooled down that the thermal donor is never activated again, and the silicon wafers Wx reaches 40 to 60 degrees in centigrade at the outlet end of the transferring mechanism 22a. Since the thermal donor is activated around 450 degrees in centigrade, the silicon wafer Wx is required to rapidly pass around 450 degrees in centigrade.

When the silicon wafer Wx reaches the outlet end of the transferring mechanism 22a, the silicon wafer Wx proceeds to the bridge table 23c, and the robotic hand mechanism 23b transfers the silicon wafer Wx to the empty wafer cassette 32. When the wafer cassette is filled with the silicon wafers, the wafer cassette is take out from the turn table 23a, and is stored in an appropriate place.

As will be appreciated from the foregoing description, the heat treatment system according to the present invention treats the silicon wafers W without any dummy wafer, and is, accordingly, high in the operability. A predetermined number of silicon wafers W are taken out from a wafer cassette, and return to an empty wafer cassette. This means that all of the silicon wafers W in the wafer cassette are identical in size. Moreover, the quartz tube 28 is maintained in high temperature over a heat treatment operation on a large number of silicon wafers W, and such a continuous heat application achieves high throughput rather than the prior art batch processes. Since the system is installed in a clean room, the silicon wafers are free from dust particles. Finally, the walking beam system transfers the silicon wafers W, and heat flux is fallen onto the entire surface of each silicon wafer W. This result in uniform heat treatment.

Second Embodiment

Figure 10:
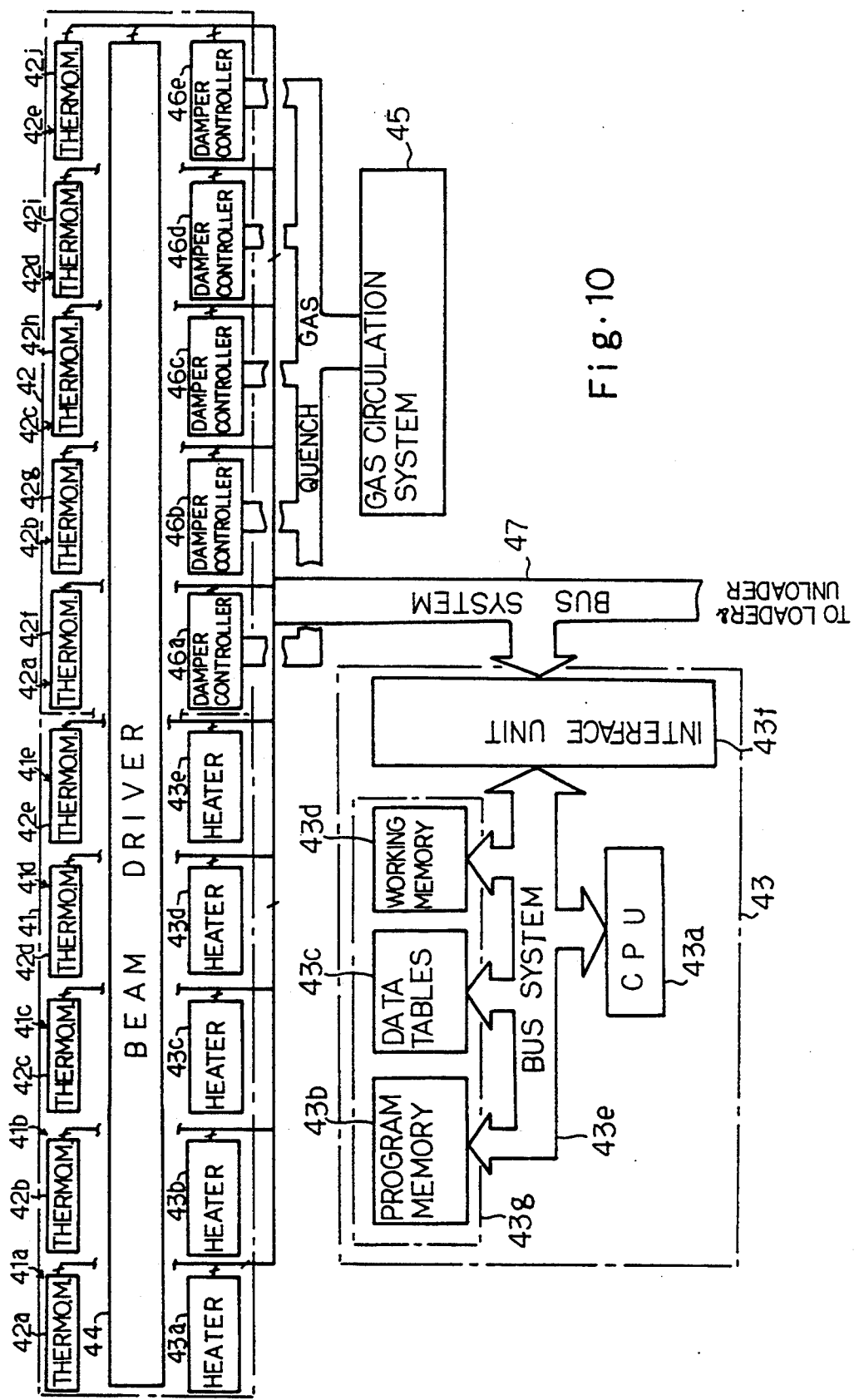
FIG. 10 is a block diagram showing the arrangement of another heat treatment system according to the present invention.

Turning to FIG. 10 of the drawings, another heat treatment system embodying the present invention largely comprises a heating unit 41, a cooling unit 42 and a controller 43. Though not shown in FIG. 10, the heat treatment system is installed in a clean room, and a loading section and an unloading section are respectively provided in association with the heating unit 41 and the cooling unit 42. Moreover, a transferring mechanism (not shown) is provided between the loading section and the unloading section, and carries silicon wafers through the heating unit 41 and the cooling unit 42. The transferring mechanism is implemented by a plurality of walking beams, and each of the plurality of working beams is similar in structure to that of the first embodiment. In this instance, at least five walking beams sequentially transfer the silicon wafers through the heating unit 41, and the silicon wafers are sequentially relayed through the cooling unit 42 by means of at least five walking beams.

As similar to the first embodiment, the heating unit 41 comprises five heating sub-units 41a, 41b, 41c, 41d and 41e respectively assigned the five waling beams, and thermo-meters 42a, 42b, 42c, 42d and 42e monitor the temperature in the heating sub-units 41a to 41e, respectively. The thermo-meters 42a to 42e are respectively associated with analog-to-digital converters (not shown), and produce digital thermo-signals indicative of the monitored temperature in the heating sub-units 41a to 41e, respectively. The heating sub-units 41a to 41e are heated with respective heaters 43a, 43b, 43c, 43d and 43e, and the heaters 43a to 43e are responsive to digital heat-control signals each indicative of increment/decrement of the temperature in the associated heating sub-unit 41a, 41b, 41c, 41d or 41e. Namely, the digital heat-control signals are respectively supplied to the heaters 43a to 43e, and the heaters 43a to 43e increase or decrease currents to the heating coils (not shown) incorporated therein. As described hereinbefore, at least five walking beams are provided inside the heating unit 41, and the five walking beams are driven by a single beam driver 44. The beam driver 44 is responsive to a digital timing control signal, and controls timings of the walking beams. Namely, the single beam driver 44 changes the moving velocity of the walking beams, and regulates the sequential motion of the walking beams.

The cooling unit also comprises five cooling sub-units 42a, 42b, 42c, 42d and 42e, and the five walking beams are respectively assigned the five cooling sub-units 42a to 42e. Thermo-meters 42f, 42g, 42h, 42i and 42j monitor the temperature in the cooling sub-units 42a to 42e, respectively. The thermo-meters 42f to 42j are respectively associated with analog-to-digital converters (not shown), and produce digital thermo-signals indicative of the monitored temperature in the cooling sub-units 42a to 42e, respectively. The cooling sub-units 42a to 42e are cooled by quench gas distributed by a gas circulation system 45, and dumpers (not shown) are provided between the gas circulation system 45 and the associated cooling subunits 42a to 42e, respectively. The dumpers are controlled by dumper controllers 46a, 46b, 46c, 46d and 46e, and the dumper controllers 46a to 46e are responsive to digital quench-control signals each indicative of increment/decrement of the temperature in the associated cooling sub-unit 42a, 42b, 42c, 42d or 42e. Namely, each of the digital quench-control signals is respectively supplied to the associated dumper controller 46a, 46b, 46c, 46d or 46e, and the associated damper increases or decreases the amount of quench gas to the associated cooling sub-unit. As described hereinbefore, at least five walking beams are provided inside the cooling unit 42, and the single beam driver 44 is shared between the five walking beams associated with the heating unit 41 and the five walking beams associated with the cooling unit 42. For this reason, the beam driver 44 causes all of the walking beams to synchronize with one another, and the silicon wafers are sequentially conveyed by the walking beams from the loading unit to the unloading unit.

The thermo-meters 42a to 42j, the heaters 43a to 43e, the beam drivers 44a to 44j and the dumper controller 46a to 46e are communicable with the controller though a bus system 47, and the controller 43 comprises a central processing unit 43a, a program memory 43b, data tables 43c, a working memory 43d, a bus system 43e, and an interface unit 43f, and the program memory 43b, the data tables 43c and the working memory 43d form in combination a memory system 43g.

The program memory 43b stores instruction codes forming in combination a program sequence, and the central processing unit 43a sequentially executes the instruction codes. The program sequence executed by the central processing unit 43a is described in detail hereinlater.

The data tables 43c are assigned to typical application heat profiles, and data tables can be increased for new application heat profiles. Each of the data tables is broken down into sub-tables assigned to the heating sub-units 41a to 41e and the cooling sub-units 42a to 42e, and shows relation between the current temperatures in the sub-units 41 to 41e and 42a to 42e and increments/decrements of electric powers to the heaters 43a to 43e, timings for controlling the walking beams and increments/decrements of the quench gas so as to achieve the given application heat profile. If the increments/decrements are respectively added to the current temperatures, the sums are indicative of the target temperatures of the individual sub-units 41a to 41e and 42a to 42e. Temperature on a silicon wafer is variable with the temperatures in the sub-units 41a to 41e and 42a to 42e as well as times consumed for passing the sub-units. For this reason, each of the data tables contains not only the increments/decrements but also the timing control data for the walking beams.

In order to establish the data tables, a thermocouple is attached to a sample wafer, and the sample wafer is conveyed through the heating unit 41 and the cooling unit 42. An analyst manually varies the electric power to the heaters 43a to 43e, the divergences of the dampers and velocities of the walking beams, and looks for the target temperatures of the respective units 41a to 41e and 42a to 42e through a trial-and-error method so as to achieve a given application heat profile. The increments/decrements and the appropriate timings are produced from the experimental results, and are memorized in the memory system 43g.

The working memory 43d provides temporally data storage for the central processing unit 43a. When the central processing unit 43a sequentially fetches the digital thermo-signals produced by the thermo-meters 42a to 42e, the temperature data indicative of the monitored temperatures are stored in the working memory 43d. The central processing unit 43a further stores intermediate data before producing the control signals.

The interface unit 43f serves as an input/output data buffer, and the digital thermo-signals, the digital heat-control signals, the digital timing control signal and the digital quench control signals are transferred between the central processing unit 43a and the thermo-meters 42a to 42j/beam driver 44/the heaters 43a to 43e/the dumper controllers 46a to 46e through the interface unit 43f.

Figure 11:
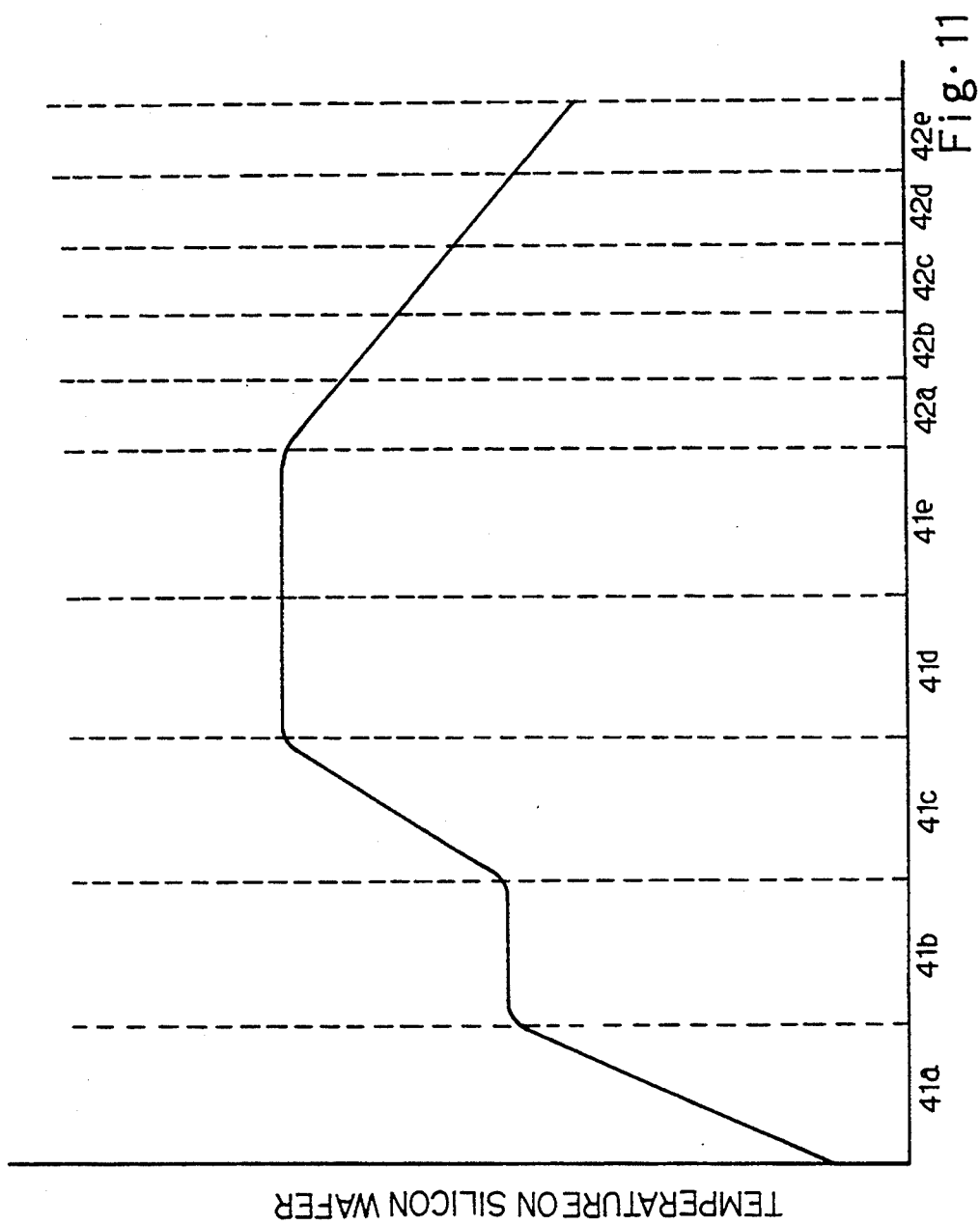
FIG. 11 is a graph showing the total amount of thermal energy supplied to a silicon wafer while the silicon wafer passes through a heating unit and a cooling unit.
Figure 12A:
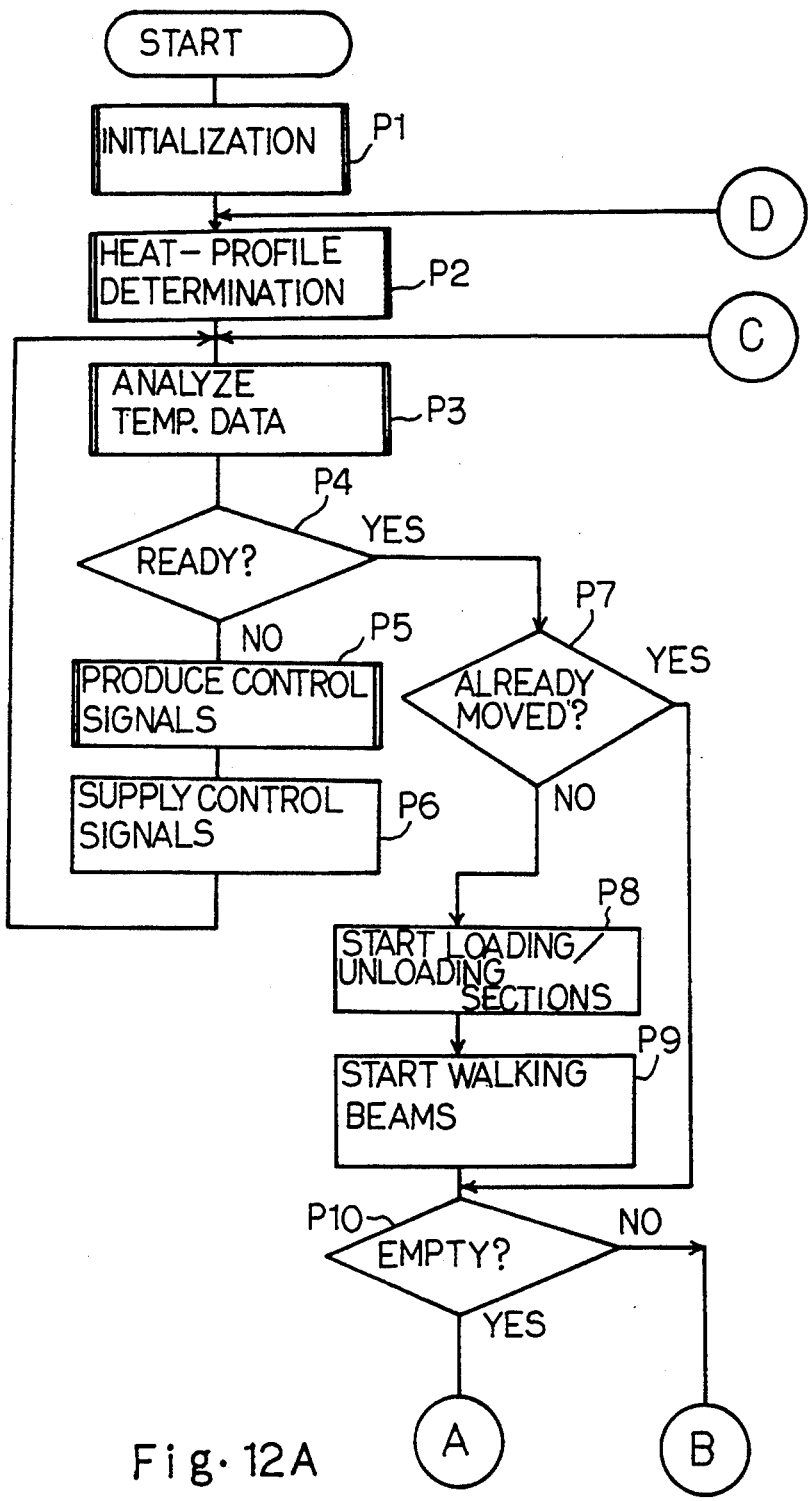
FIGS. 12A and 12B are flow charts showing a program sequence executed by a controller incorporated in the heat treatment system.
Figure 12B:
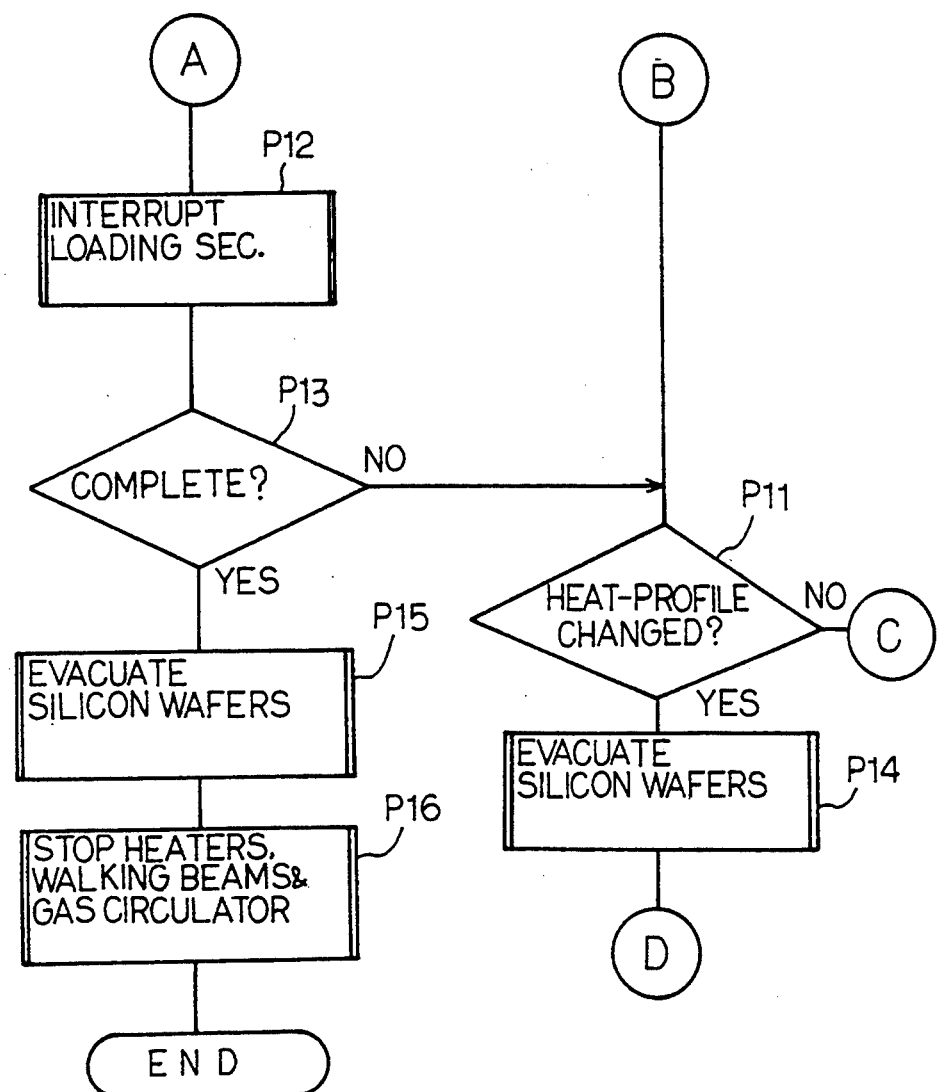

Description is hereinbelow made on the program sequence executed by the central processing unit 43a with reference to FIG. 12. When the heat treatment system is powered, the central processing 43a initializes the system as by step P1, and proceeds to step P2 upon completion of the initialization. While staying at step P2, the central processing unit 43a scans a manipulation board (not shown) to see whether or not an operator supplies profile data indicative of an application heat profile such as shown in FIG. 11. When the application heat profile is determined, the central processing unit 43a fetches the profile data through the interface unit 43f, and stores the profile data in the working memory 43d.

The central processing unit 43a proceeds to step P3, and analyzes the current status of the heating unit 41 and the cooling unit 42. Namely, the central processing unit 43a requests the monitored temperature data to the thermometers 42a to 42e, and temporally stores the monitored temperature data in the working memory 43d. The central processing unit 43a checks the data table assigned to the given application heat profile to see whether or not the current temperatures of the sub-units 41a to 41e and 42a to 42e satisfy the given application heat profile. If the current temperatures are lower or higher than target temperatures, the answer to step P4 is given negative, and the central processing unit 43a produces the heat-control signals, the quench-control signals and the timing control signal from the data table as by step P5. The central processing unit 43a proceeds to step P6, and supplies the heat-control signals, the quench-control signals and the timing control signal to the heaters 43a to 43e, the dumper controllers 46a to 46e and the beam driver 44, respectively. However, the beam driver 44 does not drive the walking beams at this stage. After the step P6, the central processing unit 43a returns to the step P3, and reiterates the loop consisting of the steps P3 to P6 until the atmospheres in the sub-units 41a to 41e and 42a to 42e are matched with the target temperatures.

When the heaters 41a to 41e and the dampers regulate the temperatures of the sub-units 41a to 41e and 42a to 42e to the target values, the answer to the step P4 is given affirmative, and the heat treatment system becomes ready for operation. The central processing unit 43a proceeds to step P7, and checks the loading and unloading sections and the walking beams to see whether or not they have already moved. When central processing unit 43a firstly reaches the step 7, the answer is given negative, and the central processing unit 43a proceeds to step P8 so as to start the loading and unloading sections. The central processing unit 43a further starts the walking beams as by step P9, and the loading section supplies silicon wafers to the walking beams. The silicon wafers are sequentially treated with heat in the heating unit 41, and are, thereafter, cooled off in the quench gas. Since the temperatures in the respective units are regulated to the target temperatures, the temperature on each silicon wafer traces the application heat profile shown in FIG. 11, and thermal donors are effectively annihilated.

The central processing unit proceeds to step P10, and checks the loading section to see whether or not at least one silicon wafer is stocked. While finding silicon wafers in the loading section, the answer to the step P10 is given negative, and the central processing unit 43a proceeds to step 11. The central processing unit 43a checks the manipulation board to see whether or not the application heat profile is changed. While the application heat profile is maintained, the answer to the step P11 is given negative, and the central processing unit 43a returns to the step P3. Thus, the central processing unit 43a reiterates the loop consisting of the steps P3 to P7, P10 and P11, and silicon wafers are successively treated with heat in accordance with the given application heat profile.

While the central processing unit 43a circulates through the loop consisting of the steps P3 to P7, P10 and P11, the current temperatures in some sub-units may be deviated from the target temperatures. In this situation, the answer to the step P4 becomes negative, and the central processing unit 43a produces the control signals again at the step P5, and supplies to the heaters 43a to 43e, the damper controller 46a to 46e and the beam driver 44 at the step P6. The heaters 43a to 43e and the damper controllers 46a to 46e regulate the temperatures of the associated sub-units, and the beam driver 44 also regulate the timings of the walking beams. When the current temperatures are recovered to the target values, the answer to the step P4 becomes affirmative, and the central processing unit 43a returns to the loop consisting of the steps P3 to P7, P10 and P11.

If all of the silicon wafers already loaded to the loading section are taken out from the unloading section, the answer to the step P10 is given affirmative, and the central processing unit 43a interrupts the loading section as by step P12. Then, the central processing unit 43a proceeds to step P13, and checks the manipulation board to see whether or not the heat treatment is terminated. If only silicon supply lags, the answer to step P13 is given negative, and the central processing unit returns to the loop consisting of the steps P3 to P7, P10 and P11.

When the manufacturer wants to treat new silicon wafers in accordance with another application heat profile, the operator manipulates the manipulation board so as to give a new application heat profile. Then, the answer to the step P11 becomes affirmative, and the central processing unit proceeds to step P14. The central processing unit evacuates all the silicon wafers already loaded from the heat treatment system, and stops the loading section, the unloading section and the walking beams. Thereafter, the central processing unit 43a returns to the step P2, and fetches new profile data from the manipulation board. The central processing unit 43a enters the loop consisting of the steps P3 to P6, and causes the heater 43a to 43e and the damper controllers 46a to 46e to regulate the atmospheres in the associated sub-units to new target temperatures. When the sub-units 41a to 41e and 42a to 42e are regulated to the new target temperatures, the answer to the step P4 becomes affirmative, and the central processing unit 43a returns to the loop consisting of the steps P3 to P7, P10 and P11.

If the operator wants to terminate the operation, the operator manipulates the manipulation board, and any new silicon wafer is not loaded to the loading section. Then, the central processing unit 43a finds that the answer to the step P10 becomes affirmative, and interrupts the loading section P12 at the step P12. Since the operator has already instructed to terminate the operation, the answer to the step P13 is given affirmative, and the central processing unit 43a evacuates all of the silicon wafers from the system as by step P15. The central processing unit 43a proceeds to step P16, and stops the heaters 43a to 43e, the walking beams 44a to 44j and the gas circulation system 45.

Although the particular embodiment of the present invention has been shown and described, it will be obvious to those skilled in the art that various changes and modifications may be made without departing from the spirit and scope of the present invention. For example, the heat treatment system according to the present invention is available for another semiconductor wafer such as germanium or compound semiconductor. The robotic hand mechanisms 21b and 23b may be equipped with vacuum pincettes, respectively. The heat treatment system according to the present invention is further available for annealing after, for example, an ion implantation process, and FIG. 8 may be applicable for a natural intrinsic gettering process in a device fabrication process. Finally, the walking beam system may be replaced with a quartz rollers arranged at intervals ranging between 20 millimeters and 30 millimeters.

What is claimed is:

1. A heat treatment system for semiconductor wafers comprising:
   a) a loading section for supplying said semiconductor wafers of silicon in succession,
   b) an outlet section for receiving said semiconductor wafers after heat treatment, and
   c) a heat treatment section associated with said loading section and said outlet section, and having
      c-1) a transfer mechanism provided between said loading section and said outlet section for successively transferring said individual semiconductor wafers from said loading section to said outlet section at a predetermined speed,
      c-2) heating means provided at a first predetermined position along said transfer mechanism for heating said semiconductor wafers, and
      c-3) cooling means, provided at a second predetermined position closer to said outlet section than said first predetermined position along said transfer mechanism, for cooling said semiconductor wafers,
   said transfer mechanism conveying the semiconductor wafers at V millimeters/second expressed as $$V = (0.3T - a) \times (Lx/900) \times (650/tx)$$

where Lx is a length of heating each semiconductor wafer in millimeters, T is ambient temperature in degree centigrade, tx is a thickness of each semiconductor wafer in micrometers, and a is a coefficient ranging from 180 to 200.

2. A heat treatment system for semiconductor wafers comprising:
   a) a loading section for supplying said semiconductor wafers in succession,
   b) an outlet section for receiving said semiconductor wafers after heat treatment, and
   c) a heat treatment section associated with said loading section and said outlet section, and having
      c-1) a transfer mechanism provided between said loading section and said outlet section for successively transferring said individual semiconductor wafers From said loading section to said outlet section at predetermined speed, c-2) a heating means provided at a first predetermined position along said transfer mechanism for heating said semiconductor wafers, and c-3) a cooling means provided at a second predetermined position closer to said outlet section than said first predetermined position along said transfer mechanism for cooling said semiconductor wafers, said transfer mechanism, said heating means and said cooling means supplying a predetermined amount of heat energy to said semiconductor wafers for annihilating donors converted from oxygen introduced in said semiconductor wafers during a crystal growth, wherein said transfer mechanism causes said semiconductor wafers to pass through a high temperature ambient in said heating means at a certain speed to supply said predetermined amount of heat energy, said certain speed and the temperature of said high temperature ambient being within a control range which, when graphically represented, is defined by a first guasi straight line determined by first and second points, a second guasi straight line determined by third and fourth points and a third guasi straight line determined by fifth and sixth points, wherein said first to sixth points are respectively indicative of said predetermined speed of 5 millimeters second and 650 degrees centigrade, 21 millimeters/second and 695 degrees centigrade, 2.5 millimeters/second and 655 degrees centigrade, 8 millimeters/second and 680 degrees centigrade, 13 millimeters/second and 695 degrees centigrade, and 21 millimeters/second and 710 degrees centigrade.

3. A heat treatment system as claimed in claim 2, wherein said transfer mechanism is enclosed by a quartz tube to which inert gas is introduced.

4. A heat treatment system for semiconductor wafers comprising:

a) a loading section for supplying said semiconductor wafers in succession, b) an outlet section for receiving said semiconductor wafers after heat treatment, and c) a heat treatment section associated with said loading section and said outlet section, and having c-1) a transfer mechanism provided between said loading section and said outlet section for successively transferring said individual semiconductor wafers from said loading section to said outlet section at predetermined speed, c-2) a heating means provided at a first predetermined position along said transfer mechanism for heating said semiconductor wafers and having a plurality of heating blocks associated with respective heat sources and respective thermometers, c-3) a cooling means provided at a second predetermined position closer to said outlet section than said first predetermined position along said transfer mechanism for cooling said semiconductor wafers and having a plurality of cooling blocks associated with respective quench-sources and respective thermometers, said transfer mechanism, said heating means and said cooling means supplying a predetermined amount of heat energy to said semiconductor wafers for annihilating donors converted from oxygen introduced in said semiconductor wafers during a crystal growth, and d) a controller for said transferring mechanism, said plurality of heating blocks and said plurality of cooling blocks, said controller monitoring temperatures of said plurality of heating blocks and temperatures of said plurality of cooling blocks through said thermo-meters for independently controlling said heat sources and said quench-sources.

5. A heat treatment system for semiconductor wafers comprising:

a) a loading section for supplying said semiconductor wafers in succession, b) an outlet section for receiving said semiconductor wafers after heat treatment, and c) a heat treatment section associated with said loading section and said outlet section, and having c-1) a transfer mechanism provided between said loading section and said outlet section for successively transferring said individual semiconductor wafers from said loading section to said outlet section at a given speed, and having a first transferring sub-mechanism variable in transferring speed and a second transferring sub-mechanism also variable in transferring speed, c-2) a plurality of heating sub-units associated with said first transferring sub-mechanism, and respectively producing temperature ambient independently regulated to target temperatures for heating said semiconductor wafers, c-3) a plurality of cooling sub-units contiguous to said plurality of heating sub-units, and associated with said second transferring sub-mechanism, said plurality of cooling sub-units producing temperature ambient independently regulated to target temperatures, respectively, and c-4) a controller storing at least one application heat profile for annihilating donors contained in said semiconductor wafers due to oxygen introduced during crystal growth, and operative to control said plurality of heating sub-units, said first transferring sub-mechanism, said plurality of cooling sub-units and said second transferring sub-mechanism so as to regulate said temperature ambient and said transferring speeds to target values for achieving said application heat profile.

* * * * *